United States Patent [19]

Courduvelis et al.

[11] Patent Number: 4,948,630

[45] Date of Patent: Aug. 14, 1990

[54] THREE STEP PROCESS FOR TREATING PLASTICS WITH ALKALINE PERMANGANATE SOLUTIONS

[75] Inventors: Constantine I. Courduvelis, Orange; Anthony E. DelGobbo, Watertown, both of Conn.

[73] Assignee: Enthone, Inc., West Haven, Conn.

[21] Appl. No.: 313,587

[22] Filed: Mar. 14, 1989

Related U.S. Application Data

[62] Division of Ser. No. 173,068, Mar. 25, 1988, Pat. No. 4,820,548, which is a division of Ser. No. 860,100, May 6, 1986, abandoned, which is a division of Ser. No. 614,912, May 29, 1984, abandoned, which is a division of Ser. No. 791,804, Oct. 28, 1985, Pat. No. 4,629,436, which is a division of Ser. No. 618,281, Jun. 7, 1984, Pat. No. 4,592,852.

[51] Int. Cl.$^5$ .............................................. C23C 3/02
[52] U.S. Cl. ..................................... 427/98; 427/307; 427/443.1; 156/668; 252/79.1; 252/79.5
[58] Field of Search .................. 427/307, 443.1, 98; 252/79.4, 79.5, 79.1; 156/650, 651, 668

[56] References Cited

U.S. PATENT DOCUMENTS

| | | |
|---|---|---|
| 3,425,947 | 2/1969 | Rausch . |
| 3,595,761 | 7/1971 | Saubestre et al. . |
| 3,647,699 | 3/1972 | Doty et al. . |
| 3,652,351 | 3/1972 | Guisti . |
| 3,725,108 | 4/1973 | Saubestre et al. . |
| 3,758,332 | 9/1973 | Dinella et al. . |
| 3,802,972 | 4/1974 | Fleischer et al. . |
| 3,833,414 | 9/1974 | Grisik et al. . |
| 3,865,623 | 2/1975 | Allen, Jr. et al. . |
| 3,898,136 | 8/1975 | Yonemitsu et al. ............. 427/296 X |
| 3,962,496 | 6/1976 | Leech . |
| 4,042,729 | 8/1977 | Polichette et al. ............. 427/305 X |
| 4,054,693 | 10/1977 | Leech et al. . |
| 4,073,740 | 2/1978 | Polichette et al. . |
| 4,086,128 | 4/1978 | Sugio et al. . |
| 4,171,240 | 10/1979 | Wong . |
| 4,374,868 | 2/1983 | Stahl et al. . |
| 4,425,380 | 1/1984 | Nuzzi et al. . |
| 4,430,154 | 2/1984 | Stahl et al. . |
| 4,474,677 | 10/1984 | Foxlee . |
| 4,481,236 | 11/1984 | Forsterling . |
| 4,515,829 | 5/1985 | Deckert et al. . |
| 4,522,850 | 6/1985 | Leech . |
| 4,597,988 | 7/1986 | Kukanskis et al. . |

FOREIGN PATENT DOCUMENTS

| | | |
|---|---|---|
| 3121015 | 12/1982 | Fed. Rep. of Germany . |
| 50-89476 | 7/1975 | Japan . |
| 50-92829 | 7/1975 | Japan . |
| 51-25771 | 3/1976 | Japan . |
| 53-88960 | 8/1978 | Japan . |
| 54153875 | 12/1978 | Japan . |
| 54-3169 | 1/1979 | Japan . |
| 54-3170 | 1/1979 | Japan . |
| 57-55933 | 4/1982 | Japan . |
| 852897 | 11/1979 | U.S.S.R. . |
| 1479556 | 7/1977 | United Kingdom . |

OTHER PUBLICATIONS

Improved Smear Removal Process For Mulitlayer Circuit Boards, by Kukanskis,-Oct. 1982.
Improved Smear Removal, by Kukanskis-Mar. 1983.
Improved Post-Desmear Process For Multilayer Boards, by Decker et al.,-May 1984.
"Smear Removal Chemistry for Consistent Hole Wall Reliability", Michael J. Barmuta, published in Apr. 1984 *PC Fab* Magazine.

*Primary Examiner*—David Simmons
*Assistant Examiner*—Thi Dang
*Attorney, Agent, or Firm*—DeLio & Associates

[57] ABSTRACT

Process for the planting of through-holes in an epoxy printed circuit board base material in the manufacture of printed circuit boards. The treatment process is designed to increase adhesion between the epoxy board material and a subsequently deposited metal plate. The process is characterized, in part, by the use of an activated permanganate solution.

45 Claims, No Drawings

THREE STEP PROCESS FOR TREATING PLASTICS WITH ALKALINE PERMANGANATE SOLUTIONS

This is a divisional of co-pending application Ser. No. 173,068 filed on Mar. 25, 1988, now U.S. Pat. No. 4,820,548, which is a divisional of co-pending application Ser. No. 860,100, filed May 6, 1986, now abandoned which is a divisional of two prior applications, including Ser. No. 614,912, filed May 29, 1984, now abandoned, and Ser. No. 791,804 filed, Oct. 28, 1985, now U.S. Pat. No. 4,629,636 (which is, in turn, a divisional of Ser. No. 618,281, filed June 7, 1984, now U.S. Pat. No. 4,592,852).

BACKGROUND OF THE INVENTION

The invention relates to the metal plating of plastics and, in particular, to enhancing the adhesion of metal plating to the plastic substrate of electronic circuit boards by treating the board in a three step process with an alkaline permanganate solution prior to electroless metal plating of the board.

The metal plating of plastic parts is well-known to be of considerable commercial importance because the desirable characteristics of both the plastic and the metal are combined to offer the technical and aesthetic advantages of each. Thus, a part plated with a bright, metallic finish takes advantage of the economies in cost and weight afforded by substituting molded plastic parts for metal and, additionally, the plated finishes are not as susceptible to pitting and corrosion because there is no galvanic reaction between a plastic substrate and a plated metal.

An important process is the preparation of electronic circuit boards which requires the electroless plating of a conductive metal layer, usually copper, onto the plastic substrate of the board, such as epoxy, and for convenience the following description will relate specifically to this process.

These boards vary in design and may have a copper layer on each surface of the epoxy (two-sided boards) or they can be multi layer boards which have a plurality of inter-leaved parallel planar copper and epoxy layers. In both type boards through-holes are drilled in the board and metal plated to facilitate connection between the circuits on the copper layers. The through-holes present an additional plating problem because resin smear on the exposed copper caused by the drilling operation acts as an insulator between the metal of the through-hole and copper layer and must be removed prior to plating. The smear is usually removed using acid and this process degrades the physical integrity of the hole making it difficult to metallize and provides little or no adhesive support for the metallic deposit.

The problems in plating either the through-holes or other plastic parts of the board are well-known in the art and a number of methods have been developed to improve the adhesion of the metal plating to the epoxy. These methods generally employ oxidants to etch the surface of the plastic prior to plating and include chromic acid, sulfuric acid and acidic and alkaline permanganate solutions. The toxicity of the chromium compounds and their potential hazards as water pollutants and the safety precautions needed with sulfuric acid have increased the commercial use of permanganate solutions, particularly alkaline permanganate solutions, and a number of patents have been granted in this area.

U.S. Pat. No. 3,652,351 shows the etching of acrylonitrile-butadiene-styrene interpolymers (ABS plastics) using a composition containing manganate and hydroxyl ions. U.S. Pat. Nos. 4,042,729 and 4,054,693 disclose stable, highly active etching solutions containing particular ratios of manganate ions and permanganate ions by controlling the pH in the range of 11 to 13. U.S. Pat. No. 4,425,380 is specifically directed to cleaning through-holes of residual manganese prior to plating by contacting the etched plastic with a water soluble compound oxidizable by permanganate to reduce the manganese residues to a low oxidation state, e.g. $SnCl_2$-HCl, formaldehyde, followed by contacting with hot alkaline hydroxide. The disclosures of the above patents are hereby incorporated by reference.

The present invention relates to a three step process for treating the plastic surface before plating. The first step includes treating the plastic surface before plating and particularly before etching to further enhance the adhesive effect of the etching procedure. This procedure is generally known as a solvent-etch technique and employs solvents which swell the plastic. U.S. Pat. No. 3,758,332 discloses the use of chemicals such as methyl ethyl ketone, tetrahydrofuran, dioxane, pyridine, dimethylformamide, and an alcohol mixture comprising methyl ethyl ketone, ethanol and methanol as swellants for epoxy resin. U.S. Pat. No. 4,086,128 also shows pretreatment of an epoxy resin with an organic solvent comprising alcohols, acids, esters, ketones, nitriles, nitro compounds, and polyhydric compounds such as ethylene glycol, glycerine and 1, 2-propylene glycol prior to etching with hydrogen peroxide and sulfuric acid. U.S. Pat. No. 3,865,623 shows immersion of epoxy resin in an organic solvent such as dimethylformamide to render the epoxy receptive to an acid etch. The disclosures of the above publications are hereby incorporated by reference. The second step includes etching the plastic with an alkaline permanganate solution to remove smear and to improve the adhesiveness of the metal plate to the plastic board. U.S. Pat. No. 4,042,729, supra, attempted to improve the use of alkaline permanganate solutions to treat plastic circuit boards and notes the many problems associated with these solutions. Thus, acidic permanganate solutions are notoriously unstable, have a short life and rapidly decompose to manganese dioxide. Alkaline permanganate solutions present similar problems but, according to the invention, are highly active, easily controllable and stable provided the molar ratio of manganate ion to permanganate ion is up to about 1.2 and the pH of the solution is controlled in the range of 11 to 13 by the use of buffers or pH adjustors. The patent also provides a means for rejuvenating the bath to remove organics and produce permanganate by disproportionation of manganate comprising bubbling $CO_2$ into the bath to lower the pH from 12.5 to 11 to 11.5, heating to form permanganate ions and manganese dioxide from the manganate ions, cooling, precipitating carbonates and filtering to remove the manganese dioxide and carbonates. The preparation and control of the compositions and rejuvenating procedures of this patent are unwieldly and time consuming and there is a need for improved alkaline permanganate etching solutions and methods for using the solutions to etch plastic substrates.

The third step includes neutralization with a reductant to solubilize manganese residues by lowering their oxidation state.

SUMMARY OF THE INVENTION

It has now been discovered that the adhesiveness of metal plating and, in particular, electroless metal plating, to plastic substrates can be enhanced by a three step process.

The first step is contacting the plastic substrate for an effective time with an alkaline composition preferably comprising:

(a) a compound represented by the general formula,

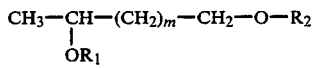

and (b) a compound represented by the general formula,

wherein $R_1$, $R_2$, $R_3$, and $R_4$ are independently selected from the group consisting of hydrogen atoms, aryl groups and alkyl groups of 1-4 carbon atoms, m is 0 to 2 and n is 2 to 5; the compositions comprising, by weight about 10 grams/liter (g/l) to saturation compound (a) and about 10 g/l to saturation compound (b).

The pH of the composition is preferably highly alkaline, e.g., greater than 10 and more preferably greater than 13, e.g., 14. It is preferred to employ a source of hydroxyl ions such as an alkali metal hydroxide and may be present in an amount of about 5 g/l to 200 g/l or more. Compound (a) is preferably propylene glycol monomethyl ether and compound (b) dimethoxy tetra ethylene glycol, with compounds (a) and (b) each being present in the solution in an amount of about 40 g/l to 120 g/l.

The composition is employed at an elevated temperature and is, in general, about 90° F. (32° C.) to the lesser of the boiling point of the solution and the softening point of the plastic. For epoxy boards the temperature is preferably about 140 to 150° F. (60 to 66° C.). (Temperatures given in degrees Celsius are approximate, i.e., the nearest whole degree Celsius to the corresponding temperature in degrees Fahrenheit, and are provided solely as a convenience to the reader.)

The effective contact time will vary with the concentration and temperature of the solution and the plastic substrate being treated and in general will not exceed about 30 minutes, preferably less than 10 minutes, e.g., 5 minutes. For epoxy boards which are to be etched in the second step with alkaline permanganate solutions a contact time of about 2 to 10 minutes at a temperature of about 140–150° F. (60–66° C.) has been found to provide excellent results.

The second step of the process uses an alkaline permanganate etching composition comprising permanganate ions and preferably including a secondary oxidant capable of oxidizing manganate ions to permanganate ions which is highly effective to treat plastic substrates prior to electroless metal deposition of the plastic. The improved permanganate compositions when used to treat plastics such as epoxy and other resins exhibit excellent stability and longterm operating life. The formation of undesirable lower oxidation state manganese products such as manganese dioxide, is lowered and additionally, the activity of the solution is also unexpectedly enhanced and shorter treatment times are generally required than with prior art compositions.

It is another important unexpected feature of the invention that the improved alkaline permanganate etching process proceeds without any significant adverse operating effects which would, for example, increase the number of treated parts being rejected for failing to meet specifications. While no theory can be advanced for the unexpected results achieved when using the compositions of the invention, it remains that the invention provides an etchant composition and procedure for preparing plastic substrates for metallization superior to any known to the prior art.

The alkaline permanganate solutions are well-known in the art and suitable compositions are shown in U.S. Pat. Nos. 4,042,729 and 4,425,380. In general, the permanganate component is present in an amount of about 1 gram per liter (g/l) to the limit of its solubility in the medium and the pH of the composition is alkaline and preferably above about 10, more preferably above about 13, e.g., between 13 and 14. The amount of the preferred secondary oxidant component having an oxidation potential greater than the oxidation potential of the alkaline permanganate solution may vary widely from about 0.5 gram equivalent of oxidant per gram equivalent of the manganate ion concentration to the stoichiometric amount, or more.

The permanganate composition is employed at an elevated temperature and is, in general, about 90° F. (33° C.) to the lesser of the boiling point of the solution and the softening point of the plastic. For epoxy boards the temperature is preferably about 140 to 160° F. (61 to 72° C.). (Temperatures given in degrees Celsius are approximate, i.e., the nearest whole degree Celsius to the corresponding temperature in degrees Fahrenheit, and are provided solely as a convenience to the reader.)

The effective contact time of step two (permanganate etching) will vary with the concentration and temperature of the permanganate solution and the plastic substrate being treated and in general will not exceed about 30 minutes, preferably 5 to 15 minutes, e.g., 10 minutes. For epoxy boards a contact time of about 8–12 minutes at a temperature of about 145–155° F. (64–69° C.) has been found to provide excellent results.

The third step of the process includes neutralization with a reductant to solubilize manganese residues by lowering their oxidation state.

In general and for purposes of illustration, the process of using the compositions of the invention in manufacturing printed circuit boards and, in particular, boards containing through-holes, is a sequence of steps commencing with a commercially available laminate or multi-laminate made from, e.g., paper-epoxy or glass-epoxy material. A predesigned series of through-holes is formed in the board in any conventional manner, then preferably etched with an acid to remove any epoxy smear over the exposed metal laminate surface and to etch-back the epoxy layer, and water rinsed. This is followed in step one of the process by contacting the board with the solvent composition of the invention to enhance the effect of the subsequent oxidative etching in step two. Similar step one type swellant compositions which are suitable to enhance the effect of the subsequent permanganate etching step are described in U.S. Pat. Nos. 3,758,332; 3,865,623 and 4,086,128, the disclosures of which are hereby incorporated by reference. After water rinsing, the board is etched with the alkaline permanganate solution of step two of the invention and water rinsed. Neutralization with a reductant to solubilize manganese residues by lowering their oxidation state is then performed as step three and the board rinsed providing a board having all the copper layers in the through-holes exposed and the epoxy etched ready for electroless metal plating using conventional procedures. A preferred step is to now dissolve some of the glass fibers in the epoxy using, for example, acid fluorides, and to pretreat the board by cleaning with a composition such as ENPLATE® PC-475 to remove hydrocarbon soils and oxides and micro-etching of the copper using an etchant such as ENPLATE AD-485. Thereafter the board is immersed in a catalyst, such as a tin-palladium solution, which conditions the surface of the epoxy for electroless copper plating. ENPLATE Activator 444 sold by Enthone, Incorporated is exemplary of this type catalyst. Following a water rinse, the laminate is immersed in an accelerator such as EN-PLATE PA-491 to activate the catalyst by freeing the metal palladium ions on the board. After a water rinse, the board is dried and is immersed in an electroless copper plating solution for a period of time sufficient to plate copper to the desired thickness on the surfaces and to plate the surfaces of the holes to form through-hole connections between the laminate surfaces. ENPLATE CU-700 and other similar plating compositions may be employed. The boards may then be electroplated using conventional techniques if a thicker coating is desired.

DETAILED DESCRIPTION OF THE INVENTION

The compositions of the invention have been found to be particularly useful for treating epoxy resins although other suitable polymeric resins may also be conditioned. The electronic circuit boards are commercially available and are of known structure and composition and include paper-epoxy and glass-epoxy laminates. In general, an epoxy resin means a polymeric compound containing at least two epoxy groups in one molecule and synthetic resins formed by ring-opening reactions of the epoxy groups of the compounds. An epoxy resin extensively used in the printed circuit industry is a cured epoxy resulting from a condensation product of epichlorohydrin and bisphenol A. A board termed FR-4, which is a fire retardant epoxy resin fiber glass cloth laminate, has demonstrated to be effectively treated by the three step process of the invention.

The epoxy resin may contain glass fibers, paper, synthetic fibers, carbon black, alumina powders, silica powders, wax, etc. as fillers, pigments, mold release agents, reinforcing agents, etc., or can be used together with phenol resins, urea resins, melamine resins, and the like.

The alkaline pH of the solvent (step one) and permanganate (step two) compositions may be provided by any suitable source and is preferably an alkaline hydroxide such as lithium, sodium, potassium, cesium, and tetraalkyl ammonium. Sodium hydroxide and potassium hydroxide are preferred for the permanganate composition and sodium hydroxide is preferred for the solvent composition.

The amount of hydroxyl ions in the solvent solution of step one can vary widely and is preferably about 40 to 120 g/l and most preferably about 60 to 100 g/l.

The compound represented by the formula

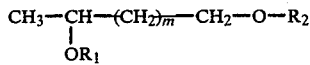

is preferably propylene glycol monomethyl ether, wherein $R_1$ is hydrogen, $R_2$ is methyl. Other compounds include propylene glycol monoethyl ether and propylene glycol monopropyl ether. A mixture of compounds wherein $R_1$ is hydrogen and $R_2$ is methyl, ethyl and propyl has provided satisfactory results. The compound is preferably present in the solution in an amount about 40 to 120 g/l, most preferably about 60 to 100 g/l.

The compound represented by the formula

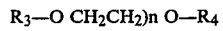

is preferably dimethoxy tetra ethylene glycol, wherein $R_3$ and $R_4$ are methyl and n is 4. Dimethoxy tri ethylene glycol (n is 3) provides satisfactory results although the tetra ethylene glycol compound is preferred. The compound is present in the solvent solution in an amount about 40 to 120 g/l, most preferably about 60 to 100 g/l.

It will be appreciated by those familiar with the art that the components of the solvent composition may vary widely, depending upon, for example, solubility considerations, with the understanding that the important criteria is the combination of compounds (a) and (b) in an alkaline solution.

Other additives, such as surfactants, may be used in the compositions for special purposes as is known in the art.

The solvent composition media is preferably aqueous and substantially inert with respect to the plastic being treated. Other media may also be employed such as alcohols with water being preferred for economic reasons and for its demonstrated effectiveness. - To practice the method of the invention the plastic substrate is contacted with the solvent composition at an elevated temperature for a time sufficient to render the surface receptive to the permanganate etching process of step two. Contacting procedures may vary widely and satisfactory results for epoxy resin are provided by immersing the part in the solvent of step one for between approximately 2 to 10 minutes at 140 to 150° F. (60 to 66° C.). The time and temperature will vary depending on the substrate being treated and the composition of the solution as will be appreciated by those skilled in the art. Other means such as spraying, may be used for treating the plastic part.

The treated plastic part is then ready for the second step of oxidative etching with the hot alkaline permanganate solution. The amount of hydroxyl ions in the permanganate solution can vary widely and is preferably about 10 to 150 g/l, or higher, and more preferably about 20 to 90 g/l, most preferably 30-70 g/l. It is preferred to measure the hydroxide ion concentration at predetermined intervals and to add more alkali as needed to maintain the desired concentration.

Any source of permanganate ion may be employed which is stable and soluble in the solution. It is preferred to employ alkali metal or alkaline earth metal salts such as sodium, potassium, lithium, cesium, calcium, etc., with potassium permanganate being preferred because of its availability and demonstrated effectiveness.

The amount of permanganate salt used in the solution may vary widely from about 1 g/l up to the limit of solubility in the medium. A preferred range is about 10 g/l to 100 g/l and more preferably about 40 g/l to 90 g/l, e.g., 50-70 g/l.

The other preferred component of the permanganate composition is a material having an oxidation potential higher than the oxidation potential of the permanganate solution and which is capable of oxidizing manganate ions to permanganate ions. While any such oxidant may be used, it is preferred that the oxidant have an oxidation potential greater than about 10% higher than the oxidation potential of the permanganate solution, and more preferably greater than about 25%, e.g., 50-100% or higher. Exemplary oxidants include chlorine, bromine, ozone, hypochlorite salts, m etaperiodate salts, trichloro-s-triazinetrione and its salts, and the like. Sodium hypochlorite is preferred because of its ease of use, availability, low cost and demonstrated effectiveness. Commercially available 13% by weight sodium hypochlorite solution (15% available chlorine) has provided excellent results.

The amount of oxidant employed may vary widely and, in a preferred embodiment, is correlated to the manganate ion concentration of the permanganate solution and, most preferably, to the total manganate ion plus permanganate ion concentration. In general, for a hypochlorite salt, a range of about 1 g/l to 100 g/l or more, may be employed, preferably 5 g/l to 50 g/l, e.g., 5 g/l to 25 g/l.

It is an important feature of the invention that permanganate ions be present at the desired concentration in order to maintain the activity of the solution. As is well-known in the art, manganate ion is formed during the treatment process which reduces the activity of the solution and leads to other undesirable results such as manganese dioxide sludge formation. The use of the secondary oxidant in the composition in effective oxidizing amounts maintains the activity of the solution, stabilizes the solution, consumes less of the expensive permanganate salt while consuming a secondary oxidant which, in may cases, is much less expensive than the permanganate salt, among other benefits.

While different methods can be employed to practice the invention, it is preferred that at desired intervals during the process the concentration of permanganate and manganate ions be determined by analytical techniques. The ratio of permanganate ion concentration to the sum of the permanganate ion and manganate ion concentrations is calculated with a ratio greater than about 0.5 being desired, and increasing ratios providing, in general, a preferred process. A ratio greater than about 0.7 is preferred, with ratios greater than about 0.8 and 0.9 being most highly preferred. Depending on the ratio, an effective amount of the secondary oxidant is added, as needed, to the solution to control the ratio at the desired level. Amounts of oxidant will vary and can be readily determined by those skilled in the art. Preferably, the ratio is determined, and, if, for example, is less than 0.7, 3% by volume of a 13% by weight NaOCl solution is added to the bath. After about 1 hour the ratio is again determined and should be above the operating level of 0.7. Since higher ratios are preferred, if the ratio is say between 0.8 and 0.85, it has been found effective to add 1% by volume of the NaOCl solution to the bath. This will maintain the ratio, depending on usage of the bath, for an operating period of at least a day (24 hours). It is preferred to analyze the bath on a daily basis and to make adjustments as needed as will be appreciated by those skilled in the art.

It is another important feature of the invention that the permanganate ion concentration be also maintained at a predetermined level in the solution, e.g., its original concentration. Permanganate ions may be added to the solution to bring the solution to the desired permanganate ion concentration based on the determined permanganate ion concentration. It has been found that highly satisfactory operating results have been achieved by summing the permanganate ion and manganate ion concentrations and adding permanganate ions based on this value and this procedure is preferred based on its demonstrated effectiveness. Thus, based on potassium permanganate, if a permanganate concentration of 65 g/l is desired and the sum of the potassium permanganate and potassium manganate concentration is 55 g/l, 10 g/l of potassium permanganate would be added to the solution.

Other additives, such as wetting agents, may be used in the permanganate composition for special purposes as is known in the art.

The permanganate composition media is preferably aqueous and substantially inert with respect to the plastic being treated. Other media may also be employed with water being preferred for economic reasons and for its demonstrated effectiveness.

To practice the method of the invention the plastic substrate is contacted with the permanganate composition at an elevated temperature for a time sufficient to render the surface receptive to the electroless metal plating process. Contacting procedures may vary widely and satisfactory results for epoxy resin are provided by immersing the part in the solvent for between approximately 5 to 15 minutes at 140° to 160° F. (61° to 72° C.). The time and temperature will vary depending on the substrate being treated and the composition of the solution as will be appreciated by those skilled in the art. Other means such as spraying, may be used for treating the plastic part.

Other permanganate etching compositions which are suitable for use with the solvent of step one are described in U.S. Pat. Nos, 4,042,729; 4,054,693 and 4,425,380.

The treated plastic part is then rinsed to remove excess solution and manganese residues are removed by neutralization or chemical reduction in step three using reductants such as hydrazine and oxalic acid.

The etched plastic part is now prepared for electroless metal plating by known means as described in U.S. Pat. Nos. 2,874,072; 3,011,920; 3,075,855; 3,095,309; 3,672,938 and 3,736,156; the disclosures of said patents being hereby incorporated by reference. In general, the plastic surface is catalyzed employing a solution containing tin and palladium followed by treatment with an accelerator solution, usually an acid, to remove excess tin and provide a palladium rich surface. The plastic is now ready for plating with an electroless metal bath such as copper. Other methods of deposition may also be used such as vacuum vapor deposition, electrolytic plating or a combination of electroless plating and electrolytic plating.

The present invention will now be described in detail by reference to the following examples.

EXAMPLE I

The following example illustrates the use of the improved permanganate composition in step two to provide an efficient, effective method for the electroless metal plating of a printed circuit board.

A two-sided copper clad epoxy-glass FR-4 laminate board was metallized using the following procedure
 (a) strip the copper clad from the surface of the board with 50% HN03 at room temperature;
 (b) rinse in water;
 (c) clean the surface with 96% sulfuric acid for 45 seconds at room temperature;

(d) rinse in water for 5 minutes;
(e) immerse for 5 minutes at 140° F. (61° C.) with mild agitation in a solution comprising:

| | |
|---|---|
| Sodium hydroxide | 90 g |
| N-Methyl-2-pyrrolidone | 100 ml |
| Ethyleneglycol monobutyl ether | 20 ml |
| Water (to make) | 1000 ml |

(f) rinse for 5 minutes in water;
(g) etch for 10 minutes at 150° F. (66° C.) with mild agitation in a solution comprising:

| | |
|---|---|
| $KMnO_4$ | 65 g |
| NaOH | 50 g |
| NaOCl | 10 g |
| Water (to make) | 1000 ml |

(h) rinse for 5 minutes in water;
(i) neutralize for 5 minutes at 140° F. (61.C) in a solution comprising:

| | |
|---|---|
| Hydrazine.$H_2SO_4$ | 25 g |
| HCl (37% aqueous) | 30 ml |
| Water (to make) | 1000 ml |

(j) rinse in water for 3 minutes;
(k) immerse in a conditioning cleaner such as ENPLATE® PC-475 for 5 minutes at 145° F. (64° C.) ENPLATE PC-475 manufactured by Enthone, Incorporated, West Haven, Conn.);
(l) rinse in water for 3 minutes;
(m) immerse in a one-step palladium catalyst such as ENPLATE Activator 444 for 5 minutes at 75° F. (25° C.);
(n) rinse with water;
(o) immerse in a post activator solution such as ENPLATE PA-491 for 5 minutes at room temperature;
(p) rinse in water for 2 minutes;
(q) metallize in an electroless copper solution such as ENPLATE CU-700 for 30 minutes at 118° F. (49° C.);
(r) rinse with water and air dry.

The metallized layer was tested for adhesion by firmly attaching a strip of adhesive tape to the metallized surface and then removing the tape with a quick snapping motion. There was no transfer of the metallized deposit to the adhesive backing of the tape.

EXAMPLE II

The following example illustrates the use of the improved permanganate composition in step two to provide an efficient, effective method for treating a printed circuit board.

A multi-layer FR-4 epoxy fiberglass copper clad board having drilled through-holes was metallized using the following procedure:
(a) immerse the board for 5 minutes at 140° F. (61° C.) in a solution comprising:

| | |
|---|---|
| N-methyl-2-pyrrolidone | 50 ml |
| Ethyleneglycol monobutyl ether | 10 ml |
| Sodium hydroxide | 45 g |
| Water (to make) | 500 ml |

(b) rinse in water;
(c) immerse the board for 10 minutes at 150° F. (66° C.) in a solution comprising:

| | |
|---|---|
| Potassium permanganate | 30 g |
| Sodium hydroxide | 25 g |
| Sodium hypochlorite | 5 g |
| Water (to make) | 500 ml |

(d) rinse in water;
(e) determine the permanganate and manganate concentrations and sodium hydroxide concentration of the solution of step (c) at predetermined intervals;
(f) calculate the ratio of potassium permanganate concentration to the sum of the potassium permanganate and potassium manganate concentration;
(g) add potassium permanganate and sodium hydroxide as needed to maintain their original concentrations the amount of $KMnO_4$ being added based on the original $KMnO_4$ concentrations minus the sum of $KMnO_4$ and $K_2MnO_4$ concentration;
(h) add sodium hypochlorite to maintain the ratio above 0.8;
(i) repeat steps (a)–(h) until a loading of 90 ft2 panel/gallon solution.

The board when metallized by steps (i)–(r) of EXAMPLE I produced strongly bonded metal deposits.

The permanganate solution required 11.8g $KMnO_4$ to maintain the original permanganate concentration and 29g NaOCl to maintain a ratio of 0.8 or better. The permanganate solution had no trace of insoluble matter on the bottom of the container.

COMPARATIVE EXAMPLE II

Example II was repeated except that the -potassium permanganate solution did not contain sodium hypochlorite. This solution required 15.6g $KMnO_4$ to maintain the original permanganate concentration and the ratio dropped to 0.40. The solution had an amorphous brownish black precipitate at the bottom of the container.

EXAMPLE II and COMPARATIVE EXAMPLE II demonstrate the reduced level of $KMnO_4$ needed to maintain the original concentration of the solution and the lack of insoluble matter contaminating the solution, which matter must be cleaned from the container. The solution of the invention has increased activity compared to the solution not containing NaOCl and lower operating temperature and/or shorter contact times can be employed. Further, a separate rejuvenation procedure such as shown in the U.S. Pat. No. 4,042,729 is not required.

EXAMPLE III

The following example illustrates the use of the improved solvent composition in step one to enhance the adhesiveness of electroless plated copper to epoxy resin which was cleaned with sulfuric acid.

A two-sided copper clad epoxy-glass FR-4 laminate board was metallized using the following procedure
(a) strip the copper clad from the surface of the board with 50% $HNO_3$ at room temperature;
(b) rinse in water;
(c) clean the surface with 96% sulfuric acid for 45 seconds at room temperature;
(d) rinse in water for 5 minutes to remove acid residues;

(e) immerse the board for 5 minutes at 145° F. (63° C.) with mild agitation in a solution comprising:

| | |
|---|---|
| NaOH | 90 g |
| Dimethoxy Tetraethylene Glycol | 80 g |
| Propylene Glycol Monomethyl Ether | 80 g |
| Water (to make) | 1000 ml |

(f) rinse for 5 minutes in water;
(g) etch for 10 minutes at 150° F. (66° F.) with mild agitation in a solution comprising:

| | |
|---|---|
| KMnO4 | 65 g |
| NaOH | 50 g |
| Water (to make) | 1000 ml |

(h) rinse for 5 minutes in water;
(i) neutralize for 5 minutes at 140° F. (60° C.) in a solution comprising:

| | |
|---|---|
| Hydrazine.H2SO4 | 25 g |
| HCl (37% aqueous) | 30 ml |
| Water (to make) | 1000 ml |

(j) rinse in water for 3 minutes;
(k) immerse in conditioning cleaner ENPLATE® PC-475 for 5 minutes at 145° F. (63° C.);
(l) rinse in water for 3 minutes;
(m) immerse in one-step palladium catalyst EN-PLATE Activator 444 for 5 minutes at 65° F. (24° C.);
(n) rinse with water;
(o) immerse in post activator solution ENPLAT PA-491 for 5 minutes at room temperature;
(p) rinse in water for 2 minutes;
(q) metallize in electroless copper solution EN-PLATE CU-700 for 30 minutes at 118° F. (48° C.); and
(r) rinse with water and air dry.

The metallized layer is tested for adhesion by firmly attaching a strip of adhesive tape to the metallized surface and then removing the tape with a quick snapping motion. There was no noticeable transfer of the metallized deposit to the adhesive backing of the tape.

COMPARATIVE EXAMPLE III

The procedure of EXAMPLE III was comparatively repeated except that step (e) (the conditioning step employing the improved solvent solution of the invention) was omitted. The metallized deposit was blistered and was poorly adherent with a significant transfer of the deposit to the adhesive backing of the tape.

COMPARATIVE EXAMPLE IV

The procedure of EXAMPLE III was comparatively repeated except that the dimethoxy tetraethylene glycol component was omitted from the composition used in step (e). The metallized deposit was poorly adherent with a significant transfer of the deposit being removed by the tape.

EXAMPLE IV

The procedure of EXAMPLE III was repeated on a drilled multi-layer epoxy-glass FR-4 laminate board. A standard copper micro-etch step using ENPLATE AD-485 was added between steps (l) and (m) and steps (a) and (b) were omitted. After metallization the board was electroplated in a standard acid copper plating solution to a deposit thickness of about 1 mil. The board was then rinsed with water, dried and coated with an activated rosin flux. The prepared board was then floated on molten tin-lead (60-40) solder at 550° F. (288° C.) for 10 seconds. After cooling the solder filled holes were cross-sectioned using standard metallurgical techniques. Microscopic examination of the copper to epoxy interface revealed no separation and the presence of a fine dendritic structure.

EXAMPLE V

The procedure of EXAMPLE IV was repeated with the omission of the concentrated sulfuric acid step (c). Microscopic examination of the copper plating to inner layer copper foil revealed a mechanically sound connection free of smeared resin.

EXAMPLE VI

The procedure of EXAMPLE VI was repeated substituting a 900 g/l solution of chromic acid at 150° F. for 2 minutes for the concentrated sulfuric acid step (c). Tightly adherent plating to the epoxy hole wall surface was obtained.

EXAMPLE VII

The procedure of EXAMPLE VI was repeated substituting a sample of a drilled multilayer laminate that had been exposed to a plasma desmearing process. Tightly adherent plating to the epoxy hole wall surface was obtained.

What is claimed is:
1. A process for treating plastics to improve the adhesion of electroless metal plating comprising the steps of:
   (a) contacting the plastic with a solvent composition comprising:
      (i) a compound represented by the general formula

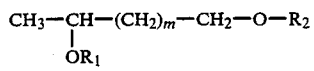

wherein $R_1$ and $R_2$ are independently selected from the group consisting of hydrogen atoms, aryl groups and alkyl groups of 1-4 carbon atoms and m is 0 to 2; and
      (ii) a compound represented by the general formula

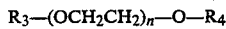

wherein $R_3$ and $R_4$ are independently selected from the group consisting of aryl groups and alkyl groups of 1-4 carbon atoms and n is 2 to 5; the composition comprising, by weight, about 10 g/l to saturation compound (i) and about 10 g/l to saturation compound (ii);
   (b) thereafter etching the solvent treated plastic with an alkaline permanganate solution for an effective time at an elevated temperature to improve said adhesion, said solution including a secondary oxidant capable of oxidizing manganate ion to permanganate ion; and
   (c) controlling in said alkaline permanganate solution, at desired intervals, the ratio of permanganate ion concentration to the sum of the permanganate and manganate ion concentration at a level about 0.5 by adding, as needed, an effective amount of the secondary oxidant to the solution.

2. The process of claim 1 wherein the ratio of permanganate ion concentration to the sum of the permanganate and manganate ion concentration is controlled in step (c) at a value above about 0.7.

3. The process of claim 1 wherein the permanganate ion concentration of the alkaline permanganate solution is maintained at a predetermined level in the solution by adding permanganate ions to the solution.

4. The process of claim 1 wherein the secondary oxidant is selected from the group consisting of chlorine, bromine, ozone, hypochlorite salts, metaperiodate salts and trichloro-s-triazinetrione salts.

5. The process of claim 4 wherein the secondary oxidant is NaOCl.

6. The process of claim 1 wherein the plastic to be treated is the plastic substrate of an electronic circuit board.

7. The process of claim 6 wherein the plastic is epoxy.

8. The process of claim 1 wherein the alkaline permanganate solution comprises:
(a) permanganate salt in an amount of about 10 g/l to its limit of solubility;
(b) secondary oxidant in an amount of about 1 g/l to 100 g/l; and
(c) alkali metal hydroxide in an amount of about 20 g/l to 90 g/l.

9. The process of claim 1 wherein the temperature of the alkaline permanganate solution is about 100° F. to 200° F.

10. The process of claim 1 wherein the temperature of the alkaline permanganate solution is about 140° F. to 160° F.

11. The process of claim 1 wherein the alkaline permanganate solution has a pH greater than about 13.

12. The process of claim 1 wherein the solvent composition is a swellant for the plastic.

13. The process of claim 1 wherein the solvent composition has a pH greater than about 10.

14. The process of claim 1 wherein the solvent composition has a pH greater than 13.

15. A process for treating the epoxy substrate of printed circuit boards to improve the adhesion of metal plating comprising the steps of:
(a) contacting the substrate with an epoxy swellant composition comprising:
(i) a compound represented by the general formula

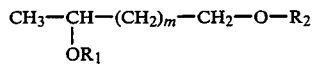

wherein $R_1$ and $R_2$ are independently selected from the group consisting of hydrogen atoms, aryl groups and alkyl groups of 1–4 carbon atoms and m is 0 to 2; and
(ii) a compound represented by the general formula

wherein $R_3$ and $R_4$ are independently selected from the group consisting of aryl groups and alkly groups of 1–4 carbon atoms and n is 2 to 5; the composition comprising by weight, about 10 g/l to saturation compound (i) and about 10 g/l to saturation compound (ii);

(b) thereafter etching the swellant treated epoxy substrate with a permanganate solution having a pH greater than about 10 for an effective time at an elevated temperature to improve said adhesion, said solution including a secondary oxidant capable of oxidizing manganate ion to permanganate ion; and
(c) controlling in said permanganate solution, at desired intervals, the ratio of permanganate ion concentration to the sum of the permanganate and manganate ion concentration at a level above 0.7 by adding, as needed, an effective amount of the secondary oxidant to the solution.

16. The process of claim 15 wherein the swellant composition has a pH greater than about 10.

17. The process of claim 15 wherein the swellant composition has a pH greater than 13.

18. The process of claim 16 wherein the permanganate solution has a pH greater than about 13.

19. The process of claim 18 wherein the secondary oxidant is NaOCl.

20. The process of claim 19 wherein the permanganate ion concentration of the permanganate solution is maintained at a predetermined level in the solution by adding permanganate ions to the solution.

21. The process of claim 20 wherein the permanganate solution comprises:
(a) permanganate salt in an amount of about 10 g/l to its limit of solubility;
(b) secondary oxidant in an amount of about 1 g/l to 100 g/l; and
(c) alkali metal hydroxide in an amount of about 20 g/l to 90 g/l.

22. The process of claim 21 wherein the temperature of the permanganate solution is about 140° F. to 160° F.

23. The process of claim 1 wherein said solvent composition is an alkaline solution.

24. The process of claim 23 wherein said solvent composition contains an alkali metal hydroxide in an amount of about 5 g/l to 200 g/l.

25. The process of claim 24 wherein said alkali metal hydroxide is sodium hydroxide.

26. The process of claim 24 wherein compound (i) is propylene glycol monomethyl ether and compound (ii) is dimethoxy tetra ethylene glycol.

27. The process of claim 26 wherein said alkali metal hydroxide, said compound (i) and said compound (ii) are each present in an amount of abut 40 to 120 g/l.

28. The process of claim 23 wherein the temperature of the solvent composition is from about 90° F. to the lesser of the boiling point of the solution and the softening point of the plastic, and the contact time is less than 30 minutes.

29. The process of claim 28 wherein the temperature is from about 140° F. to 150 ° F. and the contact time is less than about 10 minutes.

30. The process of claim 15 wherein said swellant composition is an alkaline solution.

31. The process of claim 30 wherein said solvent composition contains and alkali metal hydroxide in an amount of about 5 g/l to 200 g/l.

32. The process of claim 31 wherein said alkali metal hydroxide is sodium hydroxide.

33. The process of claim 31 wherein compound (i) is propylene glycol monomethyl ether and compound (ii) is dimethoxy tetra ethylene glycol.

34. The process of claim 33 wherein said alkali metal hydroxide, said compound (i) and said compound (ii) are each present in an amount of about 40 to 120 g/l.

35. The process of claim 30 wherein the temperature of the solvent composition is from about 90° F. to the lesser of the boiling pint of the solution and the softening point of the epoxy, and the contact time is less than 30 minutes.

36. The process of claim 35 wherein the temperature is from about 140° F. to 150° F. and the contact time is less than about 10 minutes.

37. A process for treating the epoxy substrate of printed circuit boards to improve the adhesion of metal plating comprising the steps of:
 (a) contacting the substrate with an alkaline solution of an epoxy swellant composition comprising propylene glycol monomethyl ether in an amount from about 10 g/l to saturation and dimethoxy tetraethylene glycol in an amount from about 10 g/l to saturation;
 (b) thereafter etching the swellant treated epoxy substrate with a permanganate solution having a pH greater than about 13 for an effective time at an elevated temperature to improve said adhesion, said solution including NaOCl as a secondary oxidant for oxidizing manganate ion to permanganate ion; and
 (c) controlling in said permanganate solution, at desired intervals, the ratio of permanganate ion concentration to the sum of the permanganate and manganate ion concentration at a level above 0.5 by adding, as needed, an effective amount of the NaOCl to the solution.

38. The process of claim 37 wherein said swellant composition includes sodium hydroxide.

39. The process of claim 37 wherein the swellant composition has a pH greater than about 10.

40. The process of claim 37 wherein the swellant composition has a pH greater than 13.

41. The process of claim 40 wherein the permanganate ion concentration of the permanganate solution is maintained at a predetermined level in the solution by adding permanganate ions to the solution, and the ratio of permanganate ion concentration to the sum of the permanganate and manganate ion concentration is controlled in step (c) at a value above about 0.7.

42. The process of claim 41 wherein the permanganate solution comprises:
 (a) permanganate salt in an amount of about 10 g/l to its limit of solubility;
 (b) NaOCl in an amount of about 1 g/l to 100 g/l; and
 (c) alkali metal hydroxide in an amount of about 20 g/l to 90 g/l.

43. The process of claim 42 wherein the temperature of the permanganate solution is about 140° F. to 160° F.

44. The process of claim 41 wherein the sodium hydroxide, said propylene glycol monomethyl ether and said dimethoxy tetra ethylene glycol are each present in said swellant composition in an amount of about 40 to 120 g/l.

45. The process of claim 44 wherein the temperature of said swellant composition is from about 140° F. to 150° F. and the contact time is less than 10 minutes.

* * * * *

UNITED STATES PATENT AND TRADEMARK OFFICE
CERTIFICATE OF CORRECTION

PATENT NO. : 4,948,630
DATED : Aug. 14, 1990
INVENTOR(S) : Constantine I. Courduvelis and Anthony E. DelGobbo It is certified that error appears in the above-identified patent and that said Letters Patent is hereby corrected as shown below:

In the Specification:

Column 6, line 9, delete "$R_3$-O $CH_2CH_2)_n$ O-$R_4$" and substitute therefor --$R_3$ $(OCH_2CH_2)_n$ O-$R_4$--.

Column 7, line 33, delete "may" and substitute therefor --many--.

Column 9, line 21, delete "(61.c)" and substitute therefor --(61°C)--.

Column 9, line 32, insert --(-- before "ENPLATE".

Column 11, line 10, delete "(66°F)" and substitute therefor --(61°C)--.

Column 12, line 68, delete "about" and substitute therefor --above--.

In the Claims:

Column 14, line 49, (claim 27, line 3), delete "abut" and substitute therefore --about--.

Column 14, line 62, (claim 31, line 2), delete "and" and substitute therefor --an--.

Column 15, line 6, (claim 35, line 3), delete "pint" and substitute therefor --point--.

UNITED STATES PATENT AND TRADEMARK OFFICE
CERTIFICATE OF CORRECTION

PATENT NO. : 4,948,630

DATED : Aug. 14, 1990

INVENTOR(S) : Constantine I. Courduvelis and Anthony E. DelGobbo

It is certified that error appears in the above-identified patent and that said Letters Patent is hereby corrected as shown below:

Column 11, line 31, "65°F." should read --75°F--.

line 34, "ENPLAT' should read --ENPLATE--.

Signed and Sealed this

Twenty-fourth Day of December, 1991

*Attest:*

HARRY F. MANBECK, JR.

*Attesting Officer*     *Commissioner of Patents and Trademarks*